(12) United States Patent
Starman et al.

(10) Patent No.: US 11,535,511 B2
(45) Date of Patent: Dec. 27, 2022

(54) POST-PROCESSING TECHNIQUES ON MEMS FOUNDRY FABRICATED DEVICES FOR LARGE ANGLE BEAMSTEERING

(71) Applicant: Government of the United States, as represented by the Secretary of the Air Force, Wright-Patterson AFB, OH (US)

(72) Inventors: Lavern A Starman, Dayton, OH (US); John P K Walton, Troy, OH (US); David Torres Reyes, Springboro, OH (US)

(73) Assignee: United States of America as represented by the Secretary of the Air Force, Wright-Patterson AFB, OH (US)

( * ) Notice: Subject to any disclaimer, the term of this patent is extended or adjusted under 35 U.S.C. 154(b) by 286 days.

(21) Appl. No.: 16/849,139

(22) Filed: Apr. 15, 2020

(65) Prior Publication Data
US 2020/0283289 A1    Sep. 10, 2020

Related U.S. Application Data

(63) Continuation-in-part of application No. 16/052,018, filed on Aug. 1, 2018, now Pat. No. 11,279,613.
(Continued)

(51) Int. Cl.
*G02B 26/08*    (2006.01)
*B81C 1/00*    (2006.01)
*B81B 3/00*    (2006.01)

(52) U.S. Cl.
CPC .......... *B81C 1/0038* (2013.01); *B81B 3/0037* (2013.01); *B81B 3/0043* (2013.01);
(Continued)

(58) Field of Classification Search
CPC ... B81C 1/0038; B81B 3/0037; B81B 3/0043; B81B 2201/032; B81B 2201/047;
(Continued)

(56) References Cited

U.S. PATENT DOCUMENTS 6,545,385 B2    4/2003    Miller et al.
6,601,851 B1    7/2003    Aksyuk et al.
(Continued)

OTHER PUBLICATIONS

Todd et al., "A multi-degree-of-freedom micromirror utilizing inverted-series-connected bimorph actuators," J. of Optics A: Pure and Applied Optics, vol. 8, pp. S352-S359, 2006.
(Continued)

*Primary Examiner* — Euncha P Cherry
(74) *Attorney, Agent, or Firm* — AFMCLO/JAZ; Charles R. Figer, Jr.

(57) ABSTRACT

A method of post-processing an actuator element is presented. The method begins by receiving a fabricated actuator element including a metallic layer contacting a substrate, sacrificial layer proximate the metallic layer, and a first dielectric layer on the sacrificial layer. The metallic layer has an end proximal to and contacting at least part of the substrate and a distal end extending over the first dielectric layer. A second dielectric is deposited on a portion of the metallic layer at the distal end. And, the sacrificial layer is removed.

14 Claims, 7 Drawing Sheets

Related U.S. Application Data

(60) Provisional application No. 62/702,595, filed on Jul. 24, 2018, provisional application No. 62/667,647, filed on May 7, 2018, provisional application No. 62/589,610, filed on Nov. 22, 2017, provisional application No. 62/587,734, filed on Nov. 17, 2017, provisional application No. 62/540,177, filed on Aug. 2, 2017.

(52) U.S. Cl.
CPC ..... *G02B 26/0841* (2013.01); *G02B 26/0866* (2013.01); *B81B 2201/032* (2013.01); *B81B 2201/047* (2013.01); *B81B 2203/0172* (2013.01); *B81B 2203/053* (2013.01)

(58) Field of Classification Search
CPC ...... B81B 2203/0172; B81B 2203/053; B81B 2201/042; G02B 26/0841; G02B 26/0866
USPC .................................................... 359/221.2
See application file for complete search history.

(56) References Cited

U.S. PATENT DOCUMENTS

| | | | |
|---|---|---|---|
| 6,628,857 B1 | 9/2003 | Bonadeo et al. | |
| 6,632,373 B1 | 10/2003 | Rosa et al. | |
| 6,701,037 B2 | 3/2004 | Staple et al. | |
| 6,795,603 B2 | 9/2004 | Utsunomiya | |
| 6,829,069 B2 | 12/2004 | Buzzetta | |
| 7,005,775 B2 | 2/2006 | Wan | |
| 7,057,251 B2 | 6/2006 | Reid | |
| 7,148,603 B1 | 12/2006 | Gracia et al. | |
| 7,173,748 B2 | 2/2007 | Hara et al. | |
| 7,225,674 B2 | 6/2007 | Clark | |
| 7,294,282 B1 | 11/2007 | Helmbrecht | |
| 7,344,262 B2 | 3/2008 | Greywall | |
| 7,482,664 B2 | 1/2009 | Sinclair | |
| 7,486,430 B2 | 2/2009 | Gan et al. | |
| 7,677,742 B2 | 3/2010 | Hillmer et al. | |
| 7,699,296 B1 | 4/2010 | Knollenberg et al. | |
| 8,148,874 B2 | 4/2012 | Xie et al. | |
| 8,537,446 B2 | 9/2013 | Lal et al. | |
| 8,743,449 B2 | 6/2014 | Xie et al. | |
| 9,664,896 B1 | 5/2017 | Yasumura | |
| 9,986,342 B2* | 5/2018 | Torashima | H04R 19/00 |
| 2010/0030627 A1 | 2/2010 | Lee et al. | |
| 2010/0033788 A1 | 2/2010 | Xie et al. | |
| 2012/0067709 A1* | 3/2012 | Slicker | G02B 26/0866 200/318 |
| 2013/0301101 A1 | 11/2013 | Conrad et al. | |

OTHER PUBLICATIONS

Wu et al., "A Tip-Tilt-Piston Micromirror Array for Optical Phased Array Applications," J. of Microelectromechanical Systems, vol. 19, No. 6, pp. 1450-1461, 2010.

Jia et al., "An Electrothermal Tip-Tilt-Piston Micromirror Based on Folded Dual S-Shaped Bimorphs," J. of Microelectromechanical Systems, vol. 18, No. 5, pp. 1004-1015, 2009.

Samuelson et al., "A Large Piston Displacement MEMS Mirror With Electrothermal Ladder Actuator Arrays for Ultra-Low Tilt Applications," J. of Microelectromechanical Systems, vol. 23, No. 1, pp. 39-49, 2014.

Last et al., "A Microassembled Large-Deflection Tip/Tilt Micromirror from a Single-Mask DRIE Process," Conference Proceedings in Semantic Scholar, 2006.

Sandner et al., "Out-of-plane translatory MEMS actuator with extraordinary large stroke for optical path length modulation in miniaturized FTIR spectrometers," Sensor+Test Conference 2011—IRS Proceedings, pp. 151-156, 2011.

Yang et al., "A Tip-Tilt-Piston Micromirror with an Elastomeric Universal Joint Fabricated via Micromasonry," Thesis, Graduate college of the University of Illinois at Urbana-Champaign, 2014.

Cowen et al., "PolyMUMPs™ Design Handbook, Revision 13.0.," MEMSCAP Inc., 3021 Cornwallis Road, Research Triangle Park, NC, (2011).

\* cited by examiner

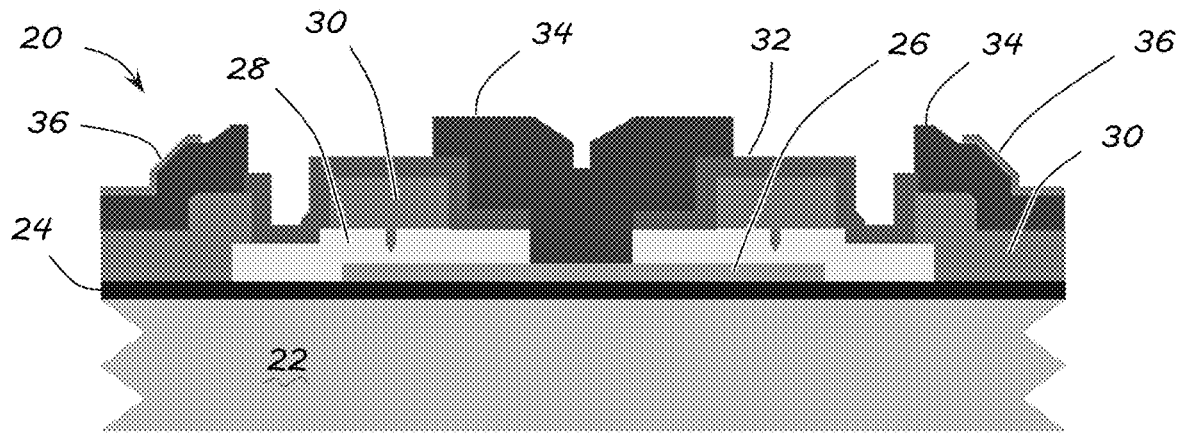

FIG. 3A

| MATERIAL LAYER | LAYER THICKNESS | LAYER DESCRIPTION |
|---|---|---|
| NITRIDE (24) | 0.6 μm | PROVIDE ELECTRICAL ISOLATION FROM WAFER |
| POLY0 (26) | 0.5 μm | ELECTRICAL LAYER FOR GROUND PLANE/ELECTRODE FORMATION |
| 1ST OXIDE (28) | 2.0 μm | FIRST SACRIFICIAL LAYER PROVIDEING GAP BETWEEN POLY0 AND POLY1 LAYERS |
| POLY1 (30) | 2.0 μm | FIRST MECHANICAL LAYER |
| 2ND OXIDE (32) | 0.75 μm | SECOND SACRIFICIAL LAYER PROVIDING GAP BETWEEN POLY1 AND POLY2 |
| POLY2 (34) | 1.5 μm | SECOND MECHANICAL LAYER |
| METAL (36) | 0.5 μm | ELECTRICAL CONTACT LAYER OR OPTICALLY REFLECTIVE SURFACE |

FIG. 3B

POST-PROCESSING TECHNIQUES ON MEMS FOUNDRY FABRICATED DEVICES FOR LARGE ANGLE BEAMSTEERING

CROSS-REFERENCE TO RELATED APPLICATIONS

This application is a continuation-in-part of U.S. application Ser. No. 16/052,018, entitled "MEMS Device for Large Angle Beamsteering,", which claims the benefit of and priority to U.S. Provisional Application Ser. No. 62/540,177, entitled "Post-Processing Techniques on MEMS Foundry Fabricated Devices for Large Angle Beamsteering," filed on Aug. 2, 2017, and U.S. Provisional Application Ser. No. 62/587,734, entitled "Segmented Control of Electrostatically Actuated Bi-Morph Beams," filed on Nov. 17, 2017, and U.S. Provisional Application Ser. No. 62/589,610, entitled "Using Surface Micromaching to Create Large Tip, Tilt, and Piston MEMS Beamsteering Structures," filed on Nov. 22, 2017, and U.S. Provisional Application Ser. No. 62/667,647, entitled "Torsional Structures to Enable Large Angle Deflections," filed on May 7, 2018, and U.S. Provisional Application Ser. No. 62/702,595, entitled "Torsional Springs to Enable Large Angle Tip/Tilt Beamsteering using MEMS," filed on Jul. 24, 2018, the entireties of which are incorporated by reference herein.

RIGHTS OF THE GOVERNMENT

The invention described herein may be manufactured and used by or for the Government of the United States for all governmental purposes without the payment of any royalty.

BACKGROUND OF THE INVENTION

Field of the Invention

The present invention generally relates to MEMS devices and, more particularly, MEMS devices capable of large angle deflections.

Description of the Related Art

Within the past decade, numerous researches have invested time in the development of micro-electro-mechanical systems (MEMS) micromirror structures, which have the ability to deflect at large angles (greater than 20 degrees). These large tip/tilt micromirrors are ideal for many applications to include microscopy, biomedical endoscopy, laser communication, wavelength selectivity, optical tuning, scene generation and various other medical instrumentations. Although many of these research efforts exhibit large tip/tilt angles, they generally do not include a piston motion for optical correction requirements or exhibit high fill-factors for large area optical scanning applications.

There currently are no large angle electrothermal or electrostatic beamsteering approaches which exhibit large tip/tilt and piston motion while creating a>90% fill-factor. Contemporary electrothermal and electrostatic designs have maximum tip or tilt angles of ±30° or ±20° for single elements but generally do not possess both capabilities. No approach with a tip or tilt angle of >10° are available which has a high fill-factor. Most if not all designs with a high fill-factor have tilt angles of less than 5°. Having devices which exhibit large tip/tilt and piston motion while creating a>90% fill-factor is very important to organizations such as the Air Force as significant interest is being placed on all platforms to reduce or essentially eliminate the numerous gimbal based systems, which protrude from the platform. Commercially, many of the same gimbal systems on aerial platforms could be replaced as well as increased medical imaging applications. Also, they would be ideal for the auto industry for future camera systems.

Accordingly, there is a need in the art for MEMS micromirrors for large angle beamsteering for numerous broadband steering and imaging applications.

SUMMARY OF THE INVENTION

Embodiments of the invention address the need in the art by enabling new and improved beamsteering systems with large beamsteering angles, high scanning speeds, while exhibiting high fill-factor (>90%) arrays which are scalable to large aperture sizes as well as enabling a multi-beam scanning capability at low voltage. These embodiments may replace many gimbal-based systems in a variety of applications since the device is nearly conformal, and it can eliminate nearly all large, moving mechanical parts of the scanning/detector system. Embodiments of the invention may be applicable to EO/IR beamsteering systems, medical endoscopy, imaging and scene generation systems, laser communications, and tracking systems. Embodiments of the invention use MEMS to enable the large angle beamsteering, scalable with regard to array size, flexible with regards to material selection, wavelengths of interest, and deflection/steering angles while being ideal for wideband applications.

Embodiments of the invention provide a method of post-processing a fabricated actuator element. The method includes receiving a fabricated actuator element containing at least a metallic or semiconducting layer contacting a substrate, a sacrificial layer proximate the metallic layer, and a first dielectric layer on the sacrificial layer. The metallic or conductive layer has an end proximal to and contacting at least part of the substrate and a distal end extending over the first dielectric layer. The method further includes depositing a second dielectric on a portion of the metallic or conductive layer at the distal end. Finally, the sacrificial layer is removed.

In a specific exemplary embodiment, depositing the second dielectric includes depositing silicon nitride on the portion of the metallic or conductive layer at the distal end. In another exemplary embodiment, depositing the second dielectric includes depositing silicon dioxide on the portion of the metallic or conductive layer at the distal end. In some embodiments, depositing the second dielectric includes depositing the second dielectric with plasma-enhanced chemical vapor deposition (PECVD); and patterning the second dielectric to achieve a desired bending moment near the distal end of the metallic or conductive layer.

In some embodiments, the fabricated actuator element may be formed using a PolyMUMPs foundry (from MEMSCAP) fabrication process or another foundry process. In other embodiments, the fabricated actuator element may be formed by depositing a first portion of a metallic layer on a substrate, depositing a sacrificial layer proximate the first portion of the metallic layer, depositing a first metal, conductive or dielectric on the sacrificial layer, and depositing a second portion of the metallic layer on the first dielectric or sacrificial layer. The second portion of the metallic or conductive layer has an end proximal to and contacting at least part of the first portion of the metallic layer and a distal end. Additionally, the second portion of the metallic or conductive layer spans from the proximal end to the distal end.

In some of these embodiments, depositing the first portion of the metallic layer includes depositing one of gold or aluminum. In these and other embodiments, depositing the second portion of the metallic layer may also include depositing one of gold, aluminum, or any other desirable metal or conductive layer compatible with the desired fabrication processes.

Additional objects, advantages, and novel features of the invention will be set forth in part in the description, which follows, and in part will become apparent to those skilled in the art upon examination of the following or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the invention.

FIG. 3A illustrates the PolyMUMPs foundry fabrication layers for an exemplary device;

FIG. 3B contains a table with material layer descriptions and thicknesses of the PolyMUMPs foundry fabrication for an exemplary device in FIG. 9A;

It should be understood that the appended drawings are not necessarily to scale, presenting a somewhat simplified representation of various features illustrative of the basic principles of the invention. The specific design features of the sequence of operations as disclosed herein, including, for example, specific dimensions, orientations, locations, and shapes of various illustrated components, will be determined in part by the particular intended application and use environment. Certain features of the illustrated embodiments have been enlarged or distorted relative to others to facilitate visualization and clear understanding. In particular, thin features may be thickened, for example, for clarity or illustration.

DETAILED DESCRIPTION OF THE INVENTION

An objective of embodiments of the invention is to enable new and improved beamsteering systems with large beamsteering angles, high scanning speeds, while exhibiting high fill-factor (>90%) arrays, which may be scalable to large aperture sizes as well as enabling a multi-beam scanning capability at low voltage. Embodiments of the invention may be used to replace many gimbal based systems in a variety of applications since the devices are nearly conformal, and can eliminate nearly all large, moving mechanical parts of the scanning/detector system. Embodiments of the invention would be applicable to EO/IR beamsteering systems, medical endoscopy, imaging and scene generation systems, laser communications, and tracking systems. Contemporary systems use gimbal systems, which are slow, with a single beamsteering direction, and no tracking capability. Some advantages associated with the embodiments of the invention is it can remove most mechanical/gimbal based systems on a platform, operate at low voltages, system can be nearly conformal, adaptable and scalable to meet a wide range of applications. Some embodiments of the invention use MEMS to enable the large angle beamsteering, scalable with regard to array size, flexible with regards to material selection, wavelengths of interest, and deflection/steering angles while being ideal for wideband applications.

Figure 1A:
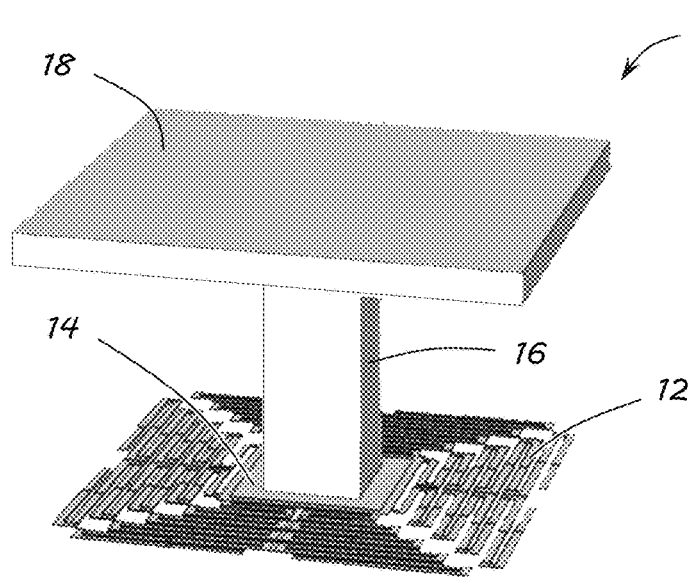
FIG. 1A illustrates an exemplary large angle beamsteering micromirror design concept in its initial state of the as fabricated structures prior to release.

FIG. 1A illustrates an exemplary center contact structural design concept with a silicon on insulator (SOI) micromirror bonded onto a bonding pad of the actuator assembly. FIG. 1A shows the basic design concept 10 with the cantilever style beams 12 attached to a bonding platform 14. This bonding platform 14 is used to bond and support the micromirror pillar 16 and mirror plate 18 to enable the deflection and piston motion. In this design, the entire structure used for actuation may be fabricated on a single wafer while the micromirror pillar and mirror may be fabricated from an SOI wafer or some other micromachining technique.

Figure 1B:
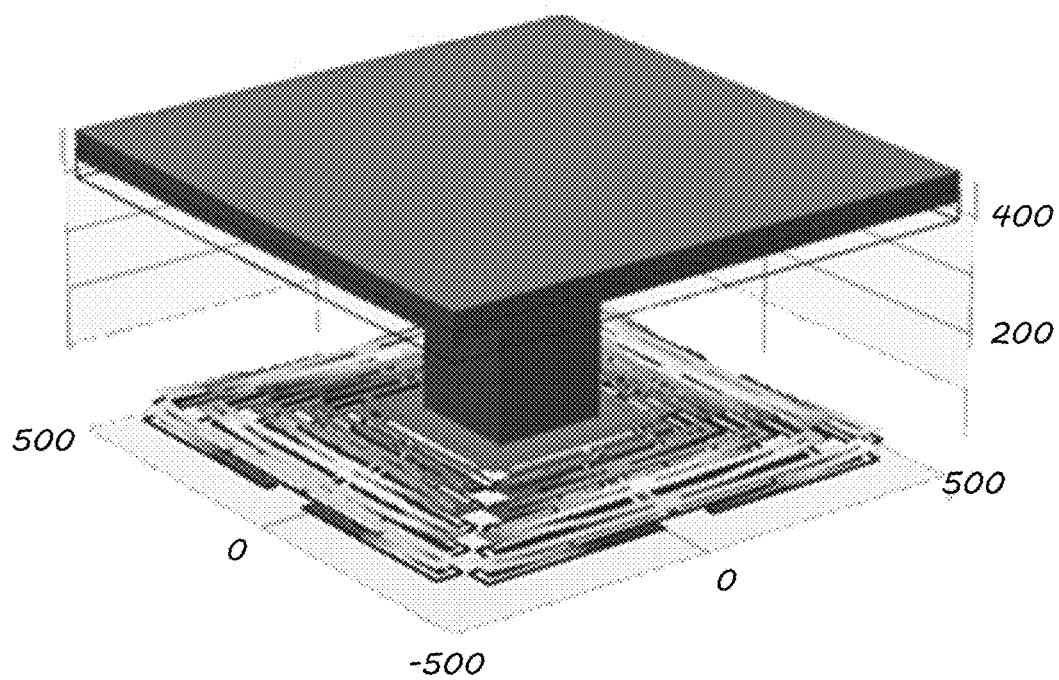
FIG. 1B illustrates an out-of-plane upward displacement following a post-processing consistent with embodiments of the invention for the exemplary concept of FIG. 1A.

FIG. 1B illustrates an upward deflection of the basic design concept 10 created by an inherent residual stress in the cantilever style beams 12 and the coefficients of thermal expansion of the selected materials to provide the initial, post-released peak displacement. All remaining deflections and piston motion will occur due to controlled, user-driven cantilever beam deflection. An overall integration between the micromirror and the actuation technique may be through basic adhesion bonding to the actuation platform in some embodiments. A MEMS commercial foundry fabrication process, such as from MEMSCAP, may be used as a baseline for these structures, though other foundry processes may also be used. However, given design rules and materials available in the PolyMUMPs foundry process for example, as fabricated devices will not meet the out-of-plane deflections necessary to enable the large tip/tilt and piston motions for large angle beamsteering. Thus, in some embodiments, a high temperature gold deposition and/or a highly compressive silicon nitride deposition layer may be required to produce the proper bending moments near the beam ends to enable the cantilever based beam structures 12, which make up the actuation system, to elevate out-of-plane at levels large enough to enable large angle beamsteering.

Figure 2A:
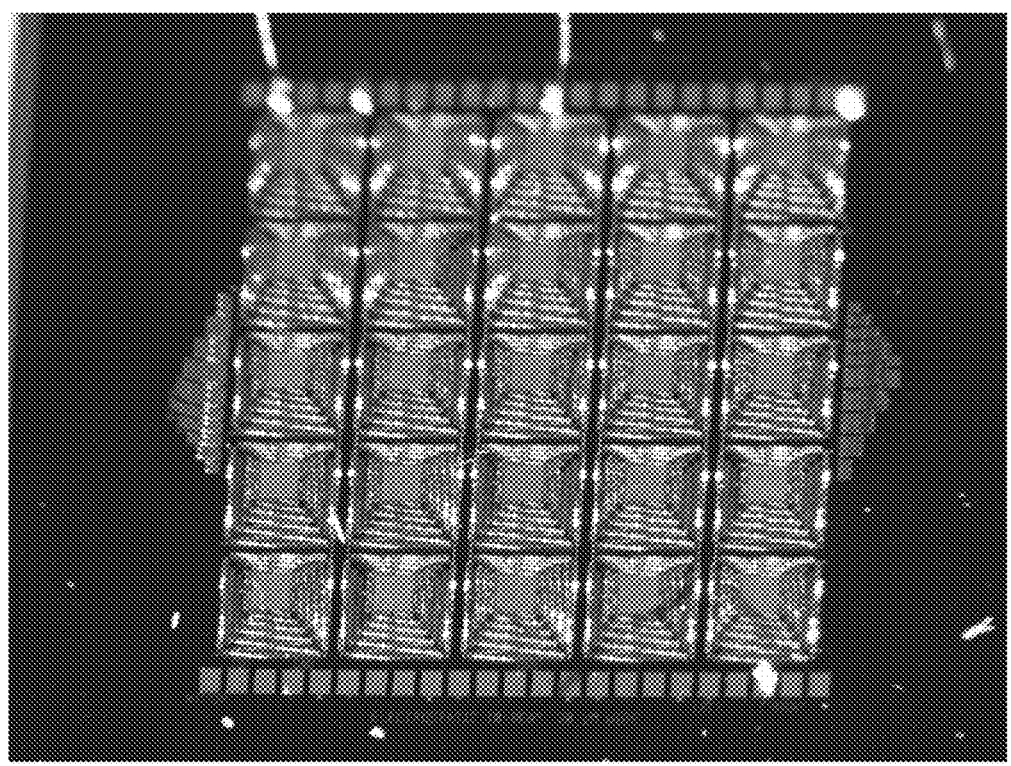
FIG. 2A shows a portion of a 5×5 array of the actuation structures, such as those in FIGS. 1A and 1B, illustrating an upward, out-of-plane deflection of the released actuation assemblies.
Figure 2B:
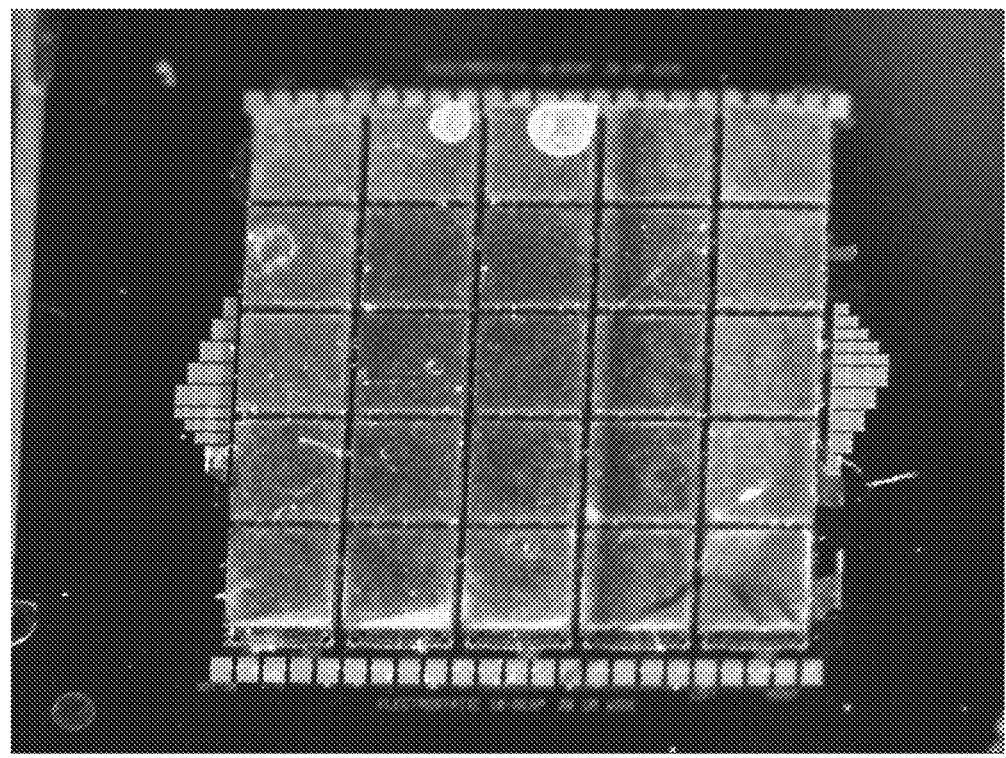
FIG. 2B illustrates a 5×5 array of micromirrors bonded to the actuators of FIG. 2A prior to release.

A key advantage to this design approach is that it is easily scalable to larger array sizes which are advantageous for many applications as shown in FIGS. 2A and 2B. FIG. 2A illustrates a segment of a larger 5×5 array of actuator assemblies after release. From the image, the significant upward, out-of-plane deflection of the actuation structures can be seen. FIG. 2B shows the identical actuation assemblies with the micromirrors bonded to the platforms prior to release.

The PolyMUMPs fabrication process is outlined in Cowen et al., "PolyMUMPs™ Design Handbook, Revision 13.0," MEMSCAP Inc., 3021 Cornwallis Road, Research Triangle Park, N.C., (2011), which is incorporated by reference herein in its entirety. FIG. 3A illustrates an exemplary cross sectional view 20 of all deposition layers and the table in FIG. 3B outlines each layer thickness and layer functionality on wafer 22. The surface material layers are deposited by low pressure chemical vapor deposition (LPCVD). The sacrificial oxide layers, which consist of phosphosilicate glass (PSG) serve two purposes: 1) defines the gaps between structural layers, and 2) serves as the dopant source for the 1050° C. high temperature phosphorus diffusions to reduce the resistivity in the polysilicon structural layers. All surface layers are patterned using standard photolithography techniques and etched using Reactive Ion Etching (RIE). The final surface layer, a 0.5 µm-thick gold metallization layer with a 100 nm chrome adhesion layer is deposited and patterned using a standard lift-off technique. Lastly, a release etch is performed to remove the sacrificial oxide layers freeing the structural polysilicon layers (Poly1 and Poly2). The typical release etch is performed by immersing the die in room temperature hydrofluoric (49%) acid for 2-3 minutes, methanol rinses to stop the HF etch, and then a supercritical carbon dioxide ($CO_2$) rapid dry to minimize stiction of the actuation assemblies. In some embodiments, such as for the electrothermal actuators designed in this process, only the Poly2 and gold layers are used to create the foundation for further device development.

As shown in FIG. 3A, there is not a dielectric layer available to deposit and pattern onto the Poly2 and gold metal layers to create the necessary bending moment near the free ends of the beams. Thus, additional post processing steps may be performed to incorporate this top dielectric layer. For the foundry process, silicon nitride may be deposited as the dielectric layer, photo lithographically pattern and etch the nitride layer to meet design requirements. Silicon dioxide will not work in this foundry process as the sacrificial layer in this process is silicon dioxide and hydrofluoric acid is used to release this structure. If silicon dioxide is used as the top dielectric layer, it will also be etched away during the release process; thus, no upward deflection can occur.

Figure 4A:
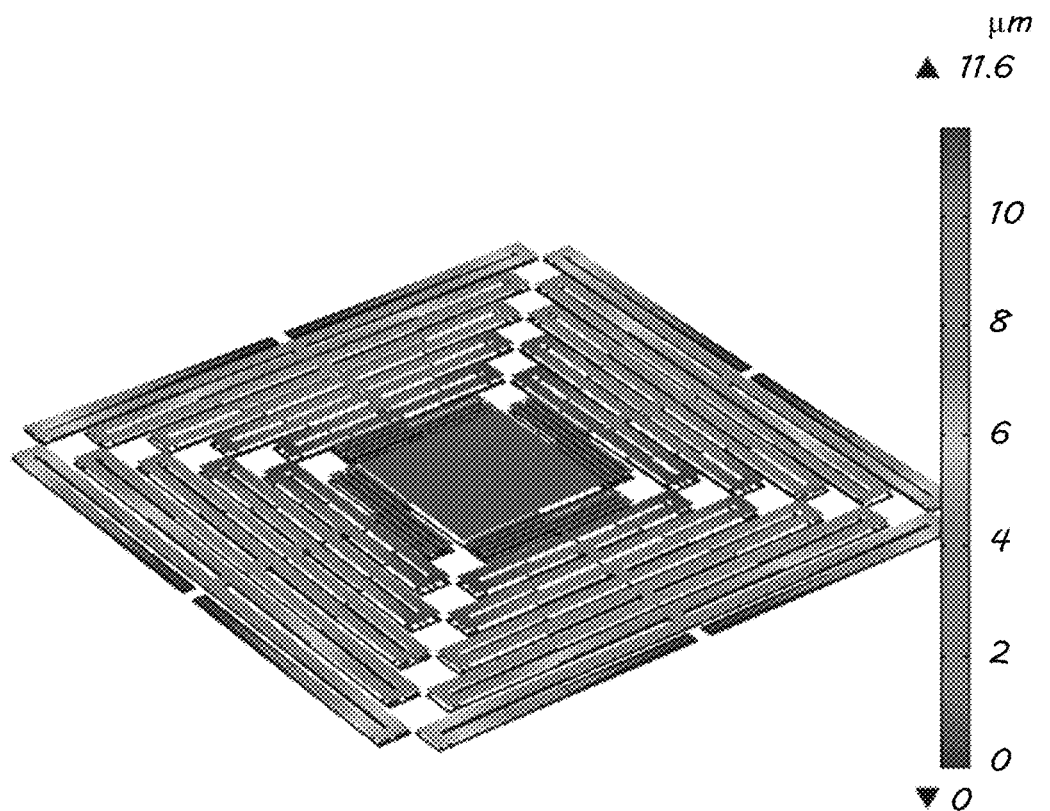
FIG. 4A illustrates an initial out-of-plane deflection for an as fabricated electrostatic actuation structure using the PolyMUMPs foundry fabrication process.
Figure 4B:
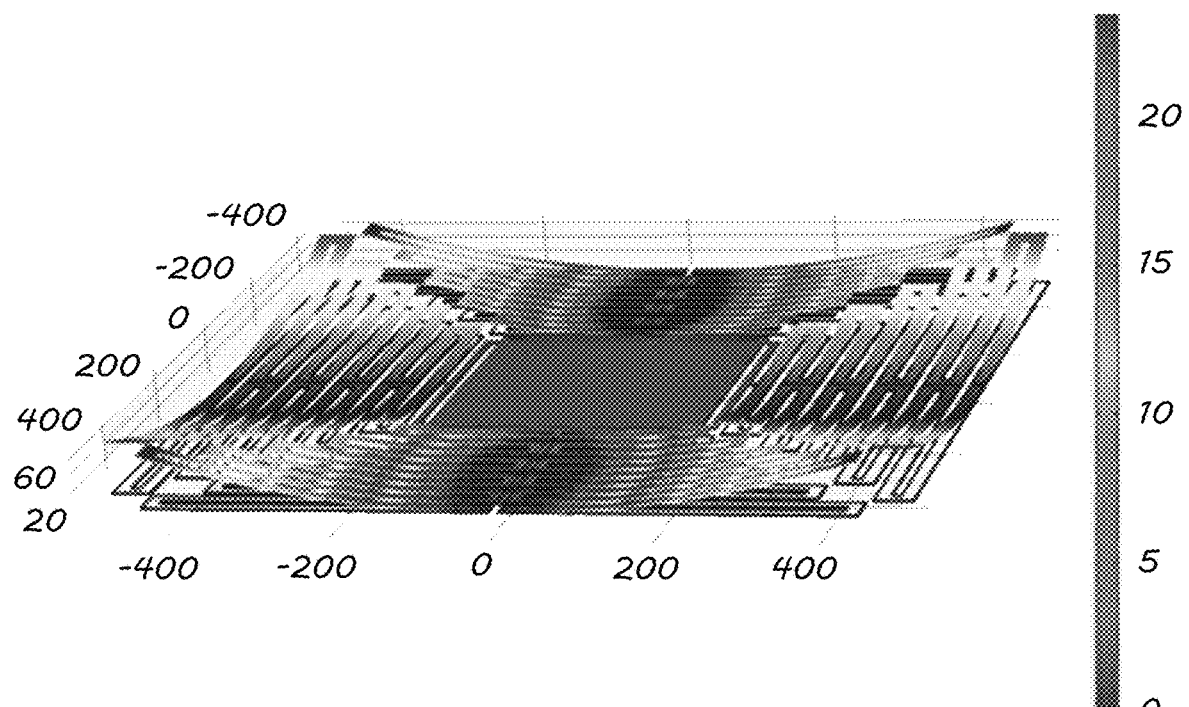
FIG. 4B illustrates an initial out-of-plane deflection for an as fabricated electrothermal actuation structure using the PolyMUMPs foundry fabrication process.

Thus, from the baseline process, several post processing steps may be performed to enable the large out-of-plane upward deflections to permit large angle beamsteering. Initial as fabricated electrostatic structures from the foundry of a set of exemplary designs provides an upward, out-of-plane deflection of approximately 10 µm to about 140 µm depending on the design and as shown in FIG. 4A. An exemplary electrothermal actuation design as simulated and illustrated in FIG. 4B shows no out-of-plane deflection of the actuation platform.

Figure 5A:
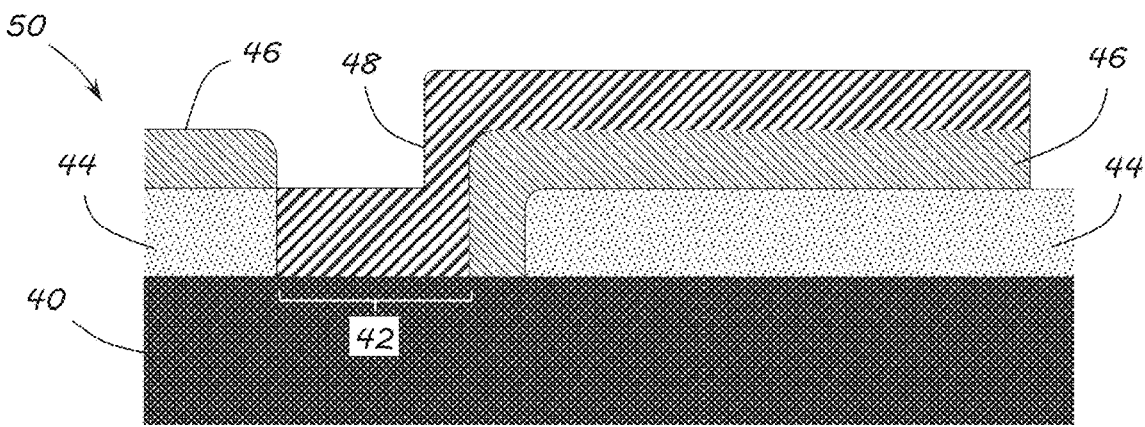
FIGS. 5A-5C illustrate a post-processing fabrication sequence of bimorph cantilever assembly consistent with embodiments of the invention.
Figure 5B:
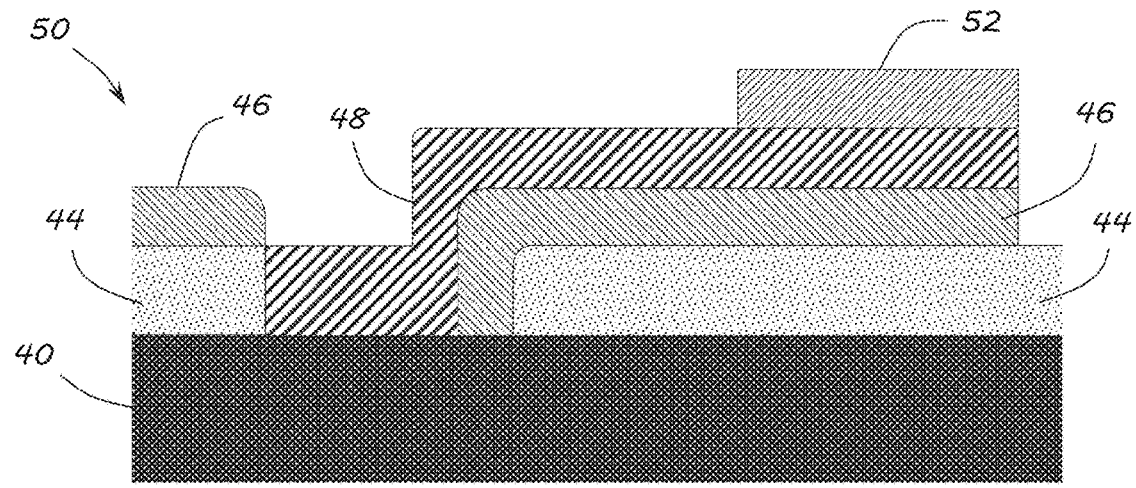
Figure 5C:
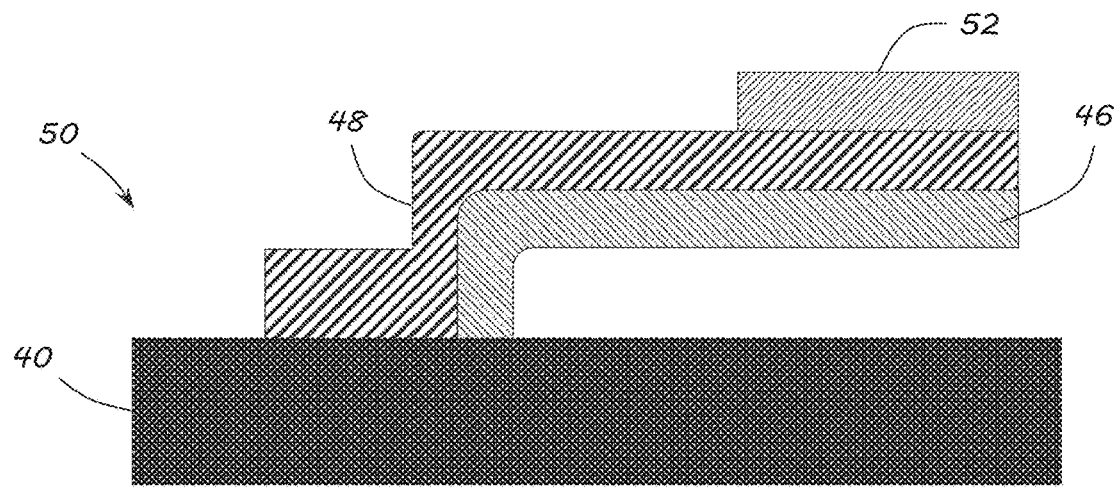

Accordingly, in order to achieve the desired deflections, additional post-processing steps need to be performed on these foundry configurations. Post-processing depositions of possibly high temperature gold and/or a compressively stressed silicon nitride layers on the above foundry structure may assist in creating the proper beam bending. FIGS. 5A-5C illustrate this process. The process begins with the baseline PolyMUMPs fabricated layers 50 in FIG. 5A. An exemplary foundry configuration may contain a glass or other wafer material 40 containing a deposited conductive or semiconducting layer 42. A sacrificial layer 44 may also be deposited. Following the sacrificial layer 44, a bottom dielectric material may form a base layer 46 of the beams of the actuation assembly. A conductive or metallic layer 48 may be deposited to form the second layer of the bimorph structure as shown in FIG. 5A.

Figure 6:
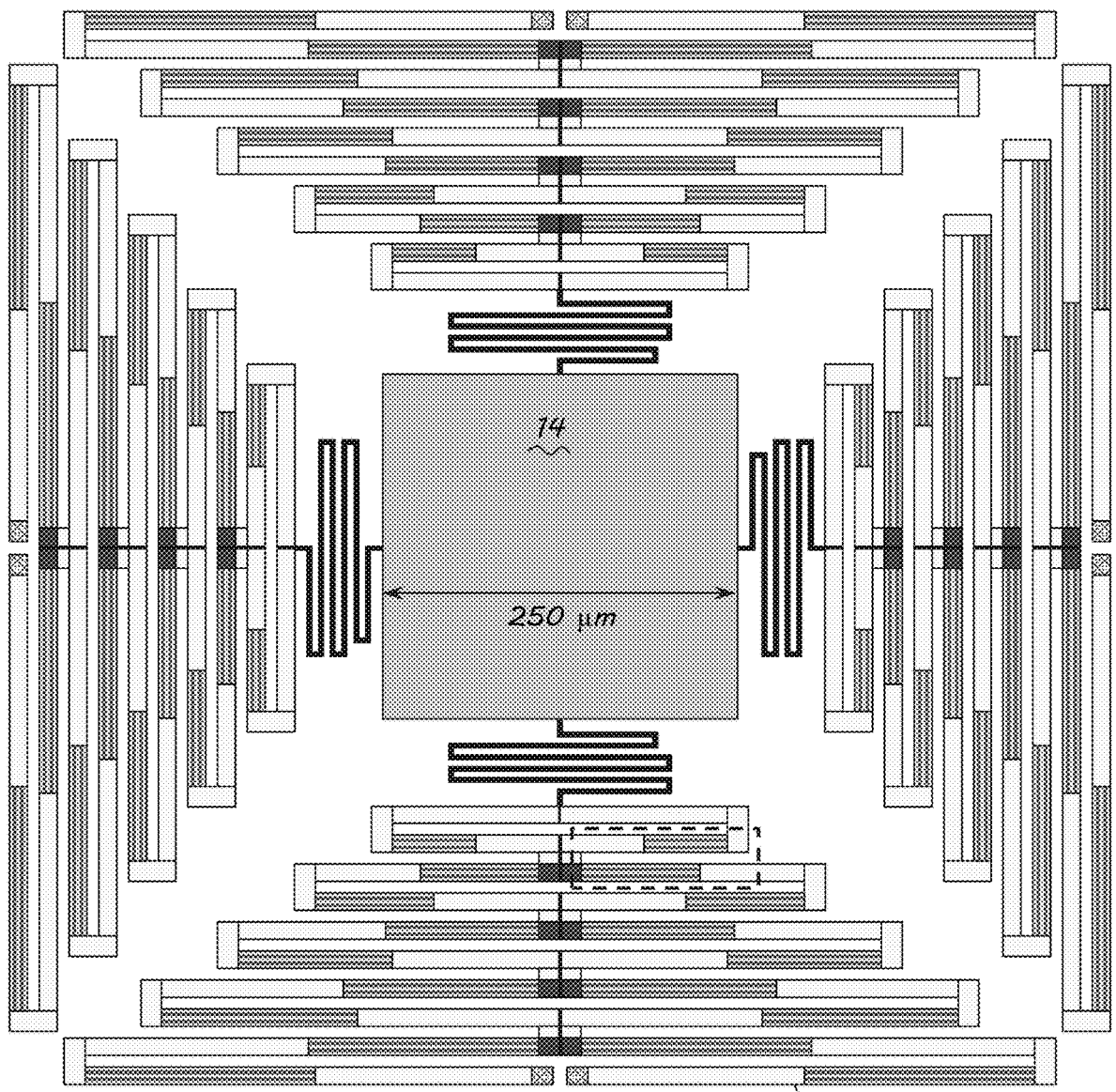
FIG. 6 illustrates an exemplary configuration using the post process fabrication of FIGS. 5A-5C.
Figure 6A:
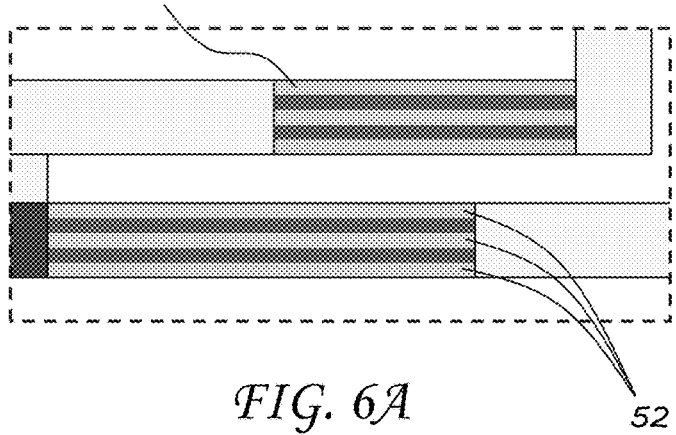
FIG. 6A is a close-up image of a portion of FIG. 6 illustrating the deposition locations to create the necessary beam bending moments for this exemplary configuration.

A second, top dielectric layer 52 of approximately 1.0 µm may then be deposited using PECVD and patterned to finish the three layer stacked beam structures which make up the actuation assembly and is shown in FIG. 5B. This top dielectric is used to create the bending moment near the freestanding ends of the beams to create the necessary S-shape or bending moment to increase the elevation of the actuation structure. The precise placement and thickness of the top dielectric 52 depositions to create the necessary beam bending moments may be seen in the magnified area (FIG. 6A) of FIG. 6. Lastly, the sacrificial layer may be removed using an etchant solution, diluted hydrofluoric acid (HF 49%) for PolyMUMPs device (see FIG. 5C), which is then followed by a $CO_2$ critical point dry to fully release and dry the actuation assembly. Depending on the peak deflection needed, the dielectric materials can be silicon nitride, silicon dioxide, or some other compatible dielectric while the metal beam material is typically either gold or aluminum, though other material combinations may also be used.

Figure 7A:
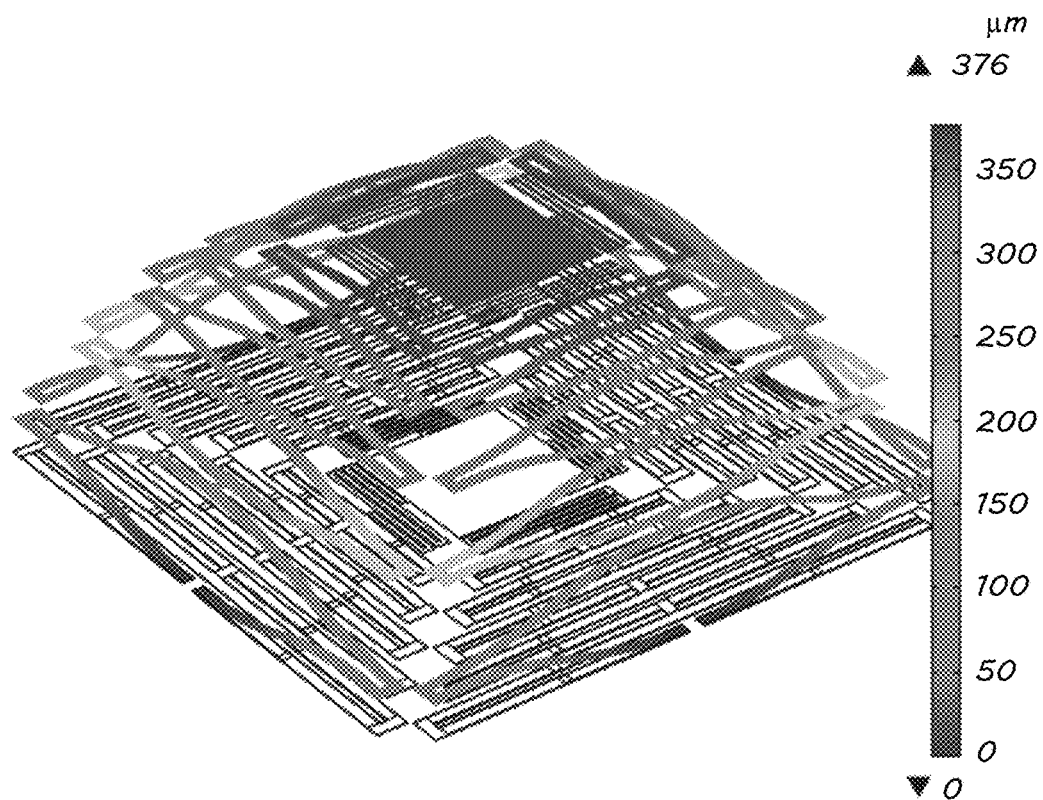
FIG. 7A illustrates an initial out-of-plane deflection for a post-processed fabricated electrostatic actuation structure of FIG. 4A.
Figure 7B:
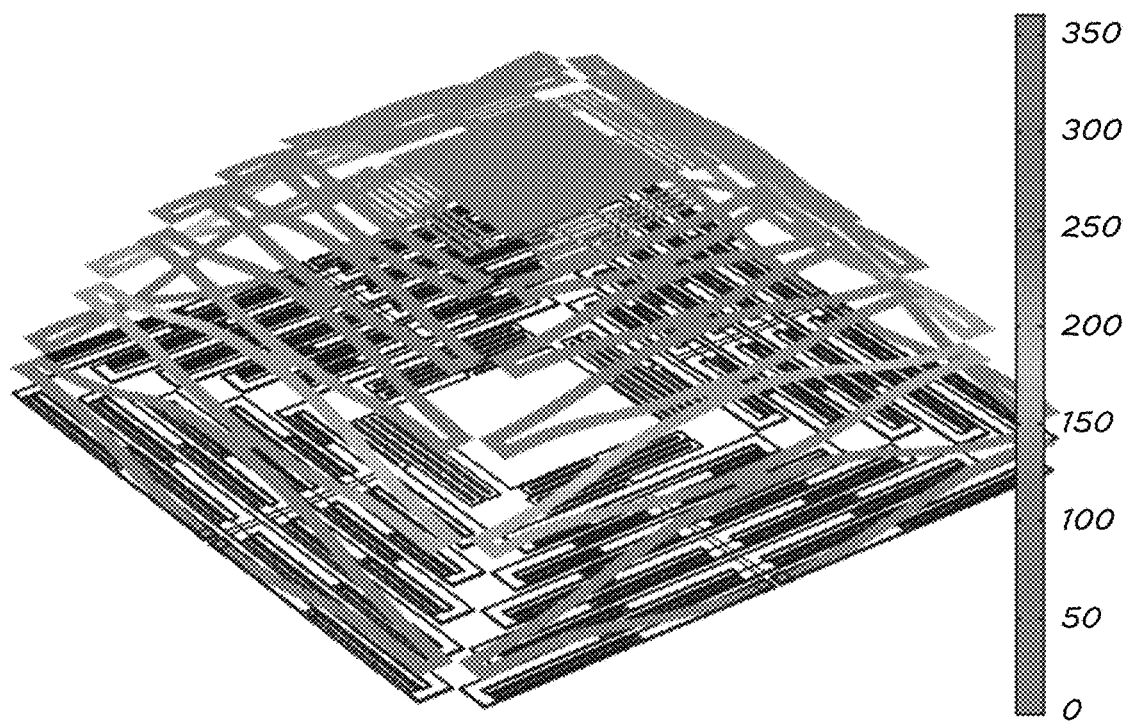
FIG. 7B illustrates an initial out-of-plane deflection for a post-processed fabricated electrothermal actuation structure of FIG. 4B.

From the addition of the high stressed silicon nitride layer, the peak out-of-plane deflections increased from greater than 200 µm to over 1 mm depending on the actuation design, silicon nitride thickness, or the compressive stress levels within the silicon nitride layer. As shown in FIG. 7A, the identical electrostatic actuation design as shown in FIG. 4A with a high stressed silicon nitride layer creates over 375 µm of upward out-of-plane deflection. Likewise, FIG. 7B shows the identical electrothermal actuation design as presented in FIG. 4B with an out-of-plane deflection of approximately 350 µm with the same high stress silicon nitride deposition.

As illustrated in FIGS. 4A and 4B, the selected post-processing methods are viable for both electrostatic and electrothermal actuation designs. A large out-of-plane deflection is the first stage to enable a large out-of-plane beamsteering technique for a micro-machined device. In general, the large out-of-plane deflections are achieved by capitalizing on the materials inherent residual stress as well as the difference in the materials coefficient of thermal expansion (CTE) to form a traditional bimorph design. In addition, the material thickness, beam lengths, the number of beams, the Young's Modulus, and the deposition of the multi-layers, which make up the beams all significantly contribute to the peak out-of-plane deflection. The actuation system of one exemplary embodiment is made up of four individually controlled bimorph actuators, which enables system tip/tilt motion to angles of ±45 degrees as well as provide a piston motion if all four actuators are biased simultaneously for wavefront correction purposes. These are generally low voltage, low power actuation systems, which operates on electrostatics (<100V) to pull down the actuators to create the required forces to tip/tilt or piston drive the overall system. The electrothermal design may also be based on the traditional bimorph structure but joule heating is the actuation mechanism at less than 5V, but the power requirements are higher. The preferred configuration for the overall system would be an array of these actuation structures which exhibit a high fill-factor>90% to mitigate signal loss and maximize beam reflection/detection.

While the present invention has been illustrated by a description of one or more embodiments thereof and while these embodiments have been described in considerable detail, they are not intended to restrict or in any way limit the scope of the appended claims to such detail. Additional advantages and modifications will readily appear to those skilled in the art. The invention in its broader aspects is therefore not limited to the specific details, representative apparatus and method, and illustrative examples shown and described. Accordingly, departures may be made from such details without departing from the scope of the general inventive concept.

What is claimed is:

1. A method of post-processing an actuator element, the method comprising:
   receiving a fabricated actuator element including:
      a conductive layer contacting a substrate;
      sacrificial layer proximate the conductive layer; and
      a first dielectric layer on the sacrificial layer;
      the conductive layer having an end proximal to and contacting at least part of the substrate and a distal end extending over the first dielectric layer;
   depositing a second dielectric on a portion of the conductive layer at the distal end; and
   removing the sacrificial layer.

2. The method of claim 1, wherein depositing the second dielectric comprises depositing silicon nitride on the portion of the conductive layer at the distal end.

3. The method of claim 1, wherein depositing the second dielectric comprises depositing silicon dioxide on the portion of the conductive layer at the distal end.

4. The method of claim 1, wherein depositing the second dielectric comprises:
   depositing the second dielectric with plasma-enhanced chemical vapor deposition (PECVD); and
   patterning the second dielectric to achieve a desired bending moment near the distal end of the conductive layer.

5. The method of claim 1, wherein the fabricated actuator element is formed using a PolyMUMPs foundry fabrication process.

6. The method of claim 1, wherein the conductive layer is a metallic layer.

7. The method of claim 1, wherein the fabricated actuator element is formed by:
   depositing a first portion of the conductive layer on the substrate;
   depositing the sacrificial layer proximate the first portion of the conductive layer;
   depositing the first dielectric layer on the on the sacrificial layer;
   depositing a second portion of the conductive layer on the first dielectric layer; and
   depositing a connecting portion of the conductive layer on the first portion of the conductive layer such that the connecting portion of the conductive layer contacts both the first portion and the second portion of the conductive layer and forms a continuous conductive layer spanning from the proximal end to the distal end.

8. The method of claim 7, wherein depositing the first portion of the conductive layer comprises depositing one of gold or aluminum.

9. The method of claim 7, wherein depositing the second portion of the conductive layer comprises depositing one of gold or aluminum.

10. A method of post-processing an actuator element, the method comprising:
    receiving a fabricated actuator element including:
       a semiconducting layer contacting a substrate;
       sacrificial layer proximate the semiconducting layer; and
       a first conductive layer on the sacrificial layer;
       the semiconducting layer having an end proximal to and contacting at least part of the substrate and a distal end extending over the first conductive layer;
    depositing a dielectric on a portion of the semiconducting layer at the distal end; and
    removing the sacrificial layer.

11. The method of claim 10, wherein depositing the second dielectric comprises depositing silicon nitride on the portion of the semiconducting layer at the distal end.

12. The method of claim 10, wherein depositing the second dielectric comprises depositing silicon dioxide on the portion of the semiconducting layer at the distal end.

13. The method of claim 10, wherein depositing the second dielectric comprises:
    depositing the second dielectric with plasma-enhanced chemical vapor deposition (PECVD); and
    patterning the second dielectric to achieve a desired bending moment near the distal end of the semiconducting layer.

14. The method of claim 10, wherein the fabricated actuator element is formed using a PolyMUMPs foundry fabrication process.

* * * * *